(12) United States Patent
Maher

(10) Patent No.: US 7,329,620 B1
(45) Date of Patent: Feb. 12, 2008

(54) SYSTEM AND METHOD FOR PROVIDING AN INTEGRATED CIRCUIT HAVING INCREASED RADIATION HARDNESS AND RELIABILITY

(75) Inventor: Michael C. Maher, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/961,970

(22) Filed: Oct. 8, 2004

(51) Int. Cl.
*H01L 21/26* (2006.01)
*H01L 29/00* (2006.01)

(52) U.S. Cl. .............. 438/795; 438/308; 438/378; 438/E27.009; 438/E23.114; 257/508; 257/659; 257/E23.124

(58) Field of Classification Search ............... 438/308, 438/795, 56–67, 378, 463; 257/508, 659
See application file for complete search history.

(56) References Cited

U.S. PATENT DOCUMENTS

| | | | |
|---|---|---|---|
| 4,380,566 A * | 4/1983 | Phy ............................ 428/192 |
| 5,740,228 A * | 4/1998 | Schmidt et al. ............. 378/161 |
| 5,889,316 A * | 3/1999 | Strobel et al. .............. 257/659 |
| 2002/0011656 A1 * | 1/2002 | Swanson et al. ........... 257/697 |
| 2003/0111719 A1 * | 6/2003 | Reiss et al. ................. 257/684 |
| 2005/0023558 A1 * | 2/2005 | Shi ............................ 257/200 |

OTHER PUBLICATIONS

Marty R. Shaneyfelt et al., Impact of Passivation Layers on Enhanced Low-Dose-Rate Sensitivity and Pre-Irradiation Elevated-Temperature Stress Effects in Bipolar Linear ICs, IEEE Transactions on Nuclear Science, vol. 49, No. 6, Dec. 2002, pp. 3171-3179.
M. R. Shaneyfelt et al., "Elimination of Enhanced Low-Dose-Rate Sensitivity and Thermal-Stress Effects in Linear Bipolar Technologies", Submitted for presentation at 2002 NSREC, pp. 1-5.
Dow Corning, Electronics Solutions, "ChipSeal Advanced Passivation: Reliability and Protection-without the package.", date is unknown.
Army RD&A, "Manufacturing Technology", Jan.-Feb. 2000.
Marty R. Shaneyfelt et al., "Passivation Layers for Reduced Total Dose Effects and ELDRS in Linear Bipolar Devices", IEEE Transactions on Nuclear Science, vol. 50, No. 6, Dec. 2003, pp. 1784-1790.
D. G. Platteter et al., "Characterization of Enhanced Low Dose Rate Sensitivity (ELDRS) Effects Using Gated Lateral PNP Transistor Structures.", date is unknown.
Y. Boulghassoul et al., "Investigation of Millisecond-Long Analog Single-Event Transients in the LM6144 Op Amp.", date is unknown.

(Continued)

*Primary Examiner*—Dung A. Le

(57) ABSTRACT

A system and method is disclosed for providing an integrated circuit that has increased radiation hardness and reliability. A device active area of an integrated circuit is provided and a layer of radiation resistant material is applied to the device active area of the integrated circuit. In one advantageous embodiment the radiation resistant material is silicon carbide. In another advantageous embodiment a passivation layer is placed between the device active area and the layer of radiation resistant material. The integrated circuit of the present invention exhibits minimal sensitivity to (1) enhanced low dose rate sensitivity (ELDRS) effects of radiation, and (2) pre-irradiation elevated temperature stress (PETS) effects of radiation.

21 Claims, 4 Drawing Sheets

OTHER PUBLICATIONS

Marty R. Shaneyfelt et al., "Developing Passivation Layers for Reducing Enhanced Low-Dose-Rate Sensitivity in Linear Bipolar Devices.", date is unknown.

J. E. Seiler et al., "The Effect of Passivation on the Enhanced Low Dose Rate Sensitivity (ELDRS) of National LM124 Opamps.", date is unknown.

* cited by examiner

SYSTEM AND METHOD FOR PROVIDING AN INTEGRATED CIRCUIT HAVING INCREASED RADIATION HARDNESS AND RELIABILITY

TECHNICAL FIELD OF THE INVENTION

The present invention is generally directed to the manufacture of integrated circuits and, in particular, to a system and method for providing integrated circuits that have increased radiation hardness and reliability.

BACKGROUND OF THE INVENTION

Electronic equipment that is used in outer space (and in other radiation environments) contains integrated circuits that are exposed to radiation. Radiation is capable of damaging the structure and operation of integrated circuits. In particular, it is known that many bipolar linear integrated circuits exhibit enhanced low-dose-rate sensitivity (ELDRS) at low electric fields. In addition, many bipolar linear integrated circuits also exhibit pre-radiation elevated temperature stress (PETS) sensitivity. In the design and manufacture of integrated circuits it is desirable to eliminate (or at least minimize) the ELDRS and PETS effects in bipolar linear integrated circuits.

It is known that the passivation layers in an integrated circuit chip have a major impact on the total radiation dose hardness of bipolar linear integrated circuits. See, for example, a paper entitled "Impact of Passivation Layers on Enhanced Low-Dose-Rate Sensitivity and Pre-Irradiation Elevated-Temperature Stress Effects in Bipolar Linear ICs" by M. R. Shaneyfelt et al., published in IEEE Transactions on Nuclear Science, Volume 49, Number 6, pp. 3171-3179, December 2002. This paper established that for one technology devices that were fabricated without passivation layers do not exhibit ELDRS or PETS sensitivity, while devices from the same production lot fabricated with either oxide or nitride or doped-glass passivation layers were ELDRS and PETS sensitive.

Therefore efforts have been made to identify the effect of various types of passivation layers on ELDRS effects in bipolar linear integrated circuits. See, for example, a paper entitled "Passivation Layers for Reduced Total Dose Effects and ELDRS in Linear Bipolar Devices" by M. R. Shaneyfelt et al., published in IEEE Transactions on Nuclear Science, Volume 50, Number 6, pp. 1784-1790, December 2003. Some passivation layers exist that are capable of significantly reducing or eliminating ELDRS effects for total doses up to one hundred kilorads (100 krad ($SiO_2$)). The mechanisms associated with ELDRS and how they correlate to the passivation layers of integrated circuits are not completely understood.

Bipolar linear integrated circuits and discrete bipolar linear products possess some degradation from the ELDRS effect. In the past only high dose rate (HDR) was performed for radiation hardness qualified products and the low dose rate (LDR) was not performed. It was generally assumed that the high dose rate (HDR) was the "worst case" condition.

After 1991 it was recognized that the ELDRS effect was a legitimate and viable failure mechanism for bipolar linear integrated circuit products that were being utilized in space. Space dose rates are much lower than the dose rates of ground radiation simulators that are presently being used for testing. Because of the ELDRS effect, many of space electronic systems are at risk of not meeting their usable life expectancy. The ELDRS effect has therefore created a systems reliability problem that is due to radiation induced parametric degradation.

Prior art attempts to solve this problem in addressing Total Ionizing Dose (TID) have been made. The prior art approaches have included the use of shielding, derating and other radiation hardening techniques. However, these prior art approaches have increased the component count of the integrated circuit, have increased the area of the integrated circuit, have increased the weight of the integrated circuit, and have increased the cost of the integrated circuit.

Therefore there is a need in the art for a system and method for finding more efficient and cost effective methods to protect integrated circuits from radiation effects. There is a need in the art for a system and method for providing integrated circuits that have increased radiation hardness and reliability. There is a need in the art for a system and method for providing integrated circuits that have minimal sensitivity to ELDRS and PETS effects.

SUMMARY OF THE INVENTION

To address the above-discussed deficiencies of the prior art, it is a primary object of the present invention to provide a system and method for providing integrated circuits that have increased radiation hardness and reliability.

In one advantageous embodiment of the present invention, a device active area of an integrated circuit is provided and a layer of radiation resistant material is applied directly to the device active area of the integrated circuit. The radiation resistant material may comprise a layer of silicon carbide. A protective layer of plastic material may then be applied to seal and protect the integrated circuit.

In another advantageous embodiment of the present invention, a device active area of an integrated circuit is provide and a passivation layer is applied directly to the device active area. A layer of radiation resistant material is then applied to the passivation layer. The radiation resistant material may comprise a layer of silicon carbide (SiC). A protective layer of plastic material may then be applied to seal and protect the integrated circuit. The passivation layer may comprise a layer of a low temperature oxide or a layer of tetraethyl ortho silicate.

The integrated circuit of the present invention exhibits reduced sensitivity to the enhanced low dose rate sensitivity (ELDRS) effects of radiation. The integrated circuit of the present invention also exhibits reduced sensitivity to the pre-irradiation elevated temperature stress (PETS) effects of radiation.

The use of silicon carbide (SiC) facilitates the use of a plastic composite material to encapsulate integrated circuits (or discrete semiconductor products) that are used in space applications.

The application of silicon carbide (SiC) directly to the device active area of an integrated circuit means that an oxide passivation deposition step may be eliminated from the manufacturing process. This reduces manufacturing cost, decreases cycle time, and increases manufacturing throughput.

It has been found that the application of silicon carbide (SiC) directly to the device active area of an integrated circuit provides the best mitigation of the ELDRS effect.

It is an object of the present invention to provide a system and method for providing an integrated circuit that has increased radiation hardness and reliability.

It is also an object of the present invention to provide a system and method for providing an integrated circuit that has minimal sensitivity to enhanced low dose rate sensitivity (ELDRS) effects of radiation.

It is yet another object of the present invention to provide a system and method for providing an integrated circuit that has minimal sensitivity to pre-irradiation elevated temperature stress (PETS) effects of radiation.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 9 and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit.

Figure 1:
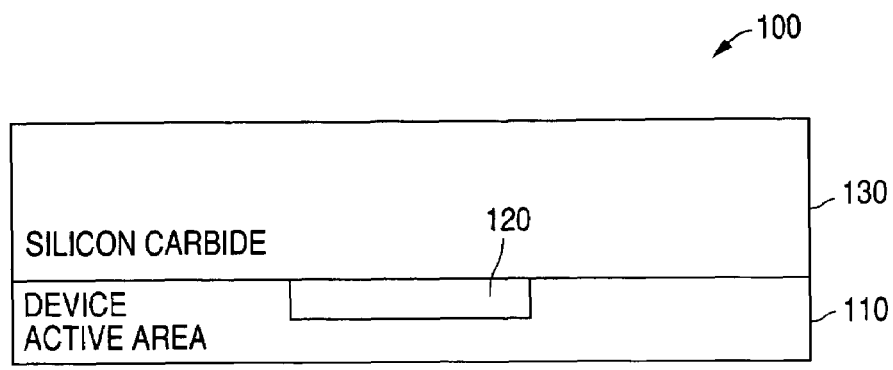
FIG. 1 illustrates a cross sectional schematic view of an advantageous embodiment of an integrated circuit of the present invention having a layer of silicon carbide deposited directly on a device active area of the integrated circuit.

FIG. 1 illustrates a cross sectional schematic view of an advantageous embodiment of an integrated circuit 100 of the present invention. The integrated circuit 100 shown in FIG. 1 comprises a silicon substrate 110. Silicon substrate 110 may be located on a conventional underlying oxide layer (not shown) that is located on an underlying handle wafer (not shown). An exemplary first metal layer 120 is embedded within silicon substrate 110. Silicon substrate 110 and first metal layer 120 comprise the device active area of integrated circuit 100.

A layer of silicon carbide 130 is deposited directly on the device active area of silicon substrate 110 and first metal layer 120. The layer of silicon carbide 130 may be deposited on the device active areas by using standard spin-on dielectric equipment. The layer of silicon carbide 130 performs the function of a passivation layer in that the layer of silicon carbide 130 prevents the scratching of the surfaces of the device active layer. The layer of silicon carbide 130 also prevents contaminants from reaching the surfaces of the device active layer.

The presence of the layer of silicon carbide 130 in integrated circuit 100 reduces the enhanced low dose rate sensitivity (ELDRS) of the device active area of integrated circuit 100. The reduction of ELDRS in integrated circuit 100 increases the radiation hardness of integrated circuit 100. This increases the reliability of integrated circuit 100 in the presence of radiation. In particular, integrated circuit 100 exhibits resistance to the effects of radiation due to electrons, gamma rays, heavy ions, protons, neutrons, alpha particles, and other types of ionizing radiation.

In addition, the presence of the layer of silicon carbide 130 in integrated circuit 100 reduces the pre-irradiation elevated temperature stress (PETS) sensitivity of the device active area of integrated circuit 100. The reduction of PETS sensitivity in integrated circuit 100 increases the radiation hardness of integrated circuit 100. This also increases the reliability of integrated circuit 100 in the presence of the types of radiation listed above.

As will be described more fully below, other embodiments of the present invention comprise a passivation layer located between the layer of silicon carbide and the underlying device active area. The advantageous embodiment of the present invention shown in FIG. 1 (in which the layer of silicon carbide 130 is applied directly to the device active area of integrated circuit 100) provides more radiation protection than the other embodiments of the present invention that have an intervening passivation layer.

Figure 2:
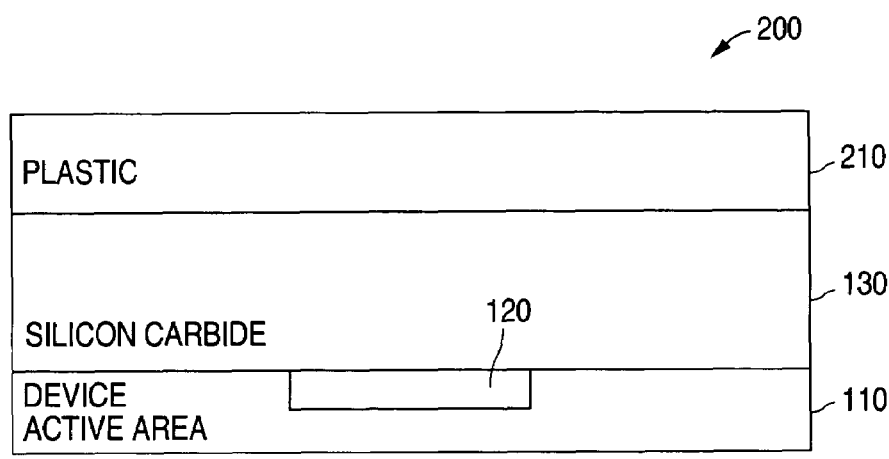
FIG. 2 illustrates a cross sectional schematic view of the integrated circuit shown in FIG. 1 having a plastic encapsulation layer.

The advantageous embodiment of the present invention shown in FIG. 1 may also be encapsulated in a plastic material (e.g., an epoxy material) in order to provide environmental protection to the integrated circuit 100. This embodiment is shown in FIG. 2. FIG. 2 illustrates a cross sectional schematic view 200 of the integrated circuit 100 shown in FIG. 1 together with a plastic encapsulation layer 210. The plastic encapsulation layer 210 is applied directly to the layer of silicon carbide 130. An integrated circuit that is encapsulated in a plastic protective material (such as plastic encapsulation layer 210) is generally referred to as a plastic encapsulated microcircuit (PEM).

Figure 3:
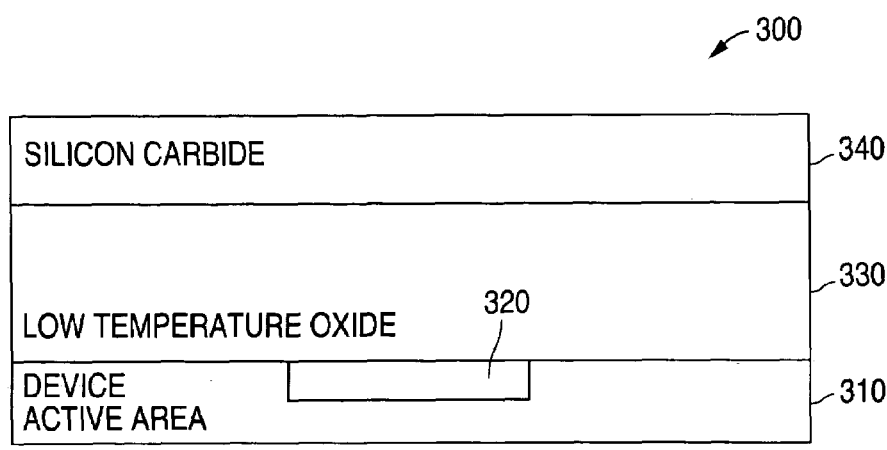
FIG. 3 illustrates a cross sectional schematic view of an advantageous embodiment of an integrated circuit of the present invention having a layer of silicon carbide deposited on a layer of low temperature oxide that is deposited over a device active area of the integrated circuit.

In an alternate advantageous embodiment of the present invention, a passivation layer may be placed between the layer of silicon carbide and the underlying device active area. FIG. 3 illustrates a cross sectional schematic view of such an alternate advantageous embodiment of an integrated circuit of the present invention. The integrated circuit 300 shown in FIG. 3 comprises a silicon substrate 310. Silicon substrate 310 may be located on a conventional underlying oxide layer (not shown) that is located on an underlying handle wafer (not shown). An exemplary first metal layer 320 is embedded within silicon substrate 310. Silicon substrate 310 and first metal layer 320 comprise the device active area of integrated circuit 300.

A layer of low temperature oxide 330 is deposited directly on the device active area of silicon substrate 310 and first metal layer 320. The layer of low temperature oxide 330 may be deposited on the device active areas by using standard spin-on dielectric equipment. The layer of low temperature oxide 330 is a passivation layer that prevents the scratching of the surfaces of the device active layer. The layer of low temperature oxide 330 also prevents contaminants from reaching the surfaces of the device active layer.

A layer of silicon carbide 340 is deposited directly on the layer of low temperature oxide 330. The layer of silicon carbide 340 may be deposited on the layer of low temperature oxide 330 by using standard spin-on dielectric equipment.

The presence of the layer of silicon carbide 340 in integrated circuit 300 reduces the enhanced low dose rate sensitivity (ELDRS) of the device active area of integrated circuit 300. The reduction of ELDRS in integrated circuit 300 increases the radiation hardness of integrated circuit 300. This increases the reliability of integrated circuit 300 in the presence of radiation. In particular, integrated circuit 300 exhibits resistance to the effects of radiation due to electrons, gamma rays, heavy ions, protons, neutrons, alpha particles, and other types of ionizing radiation.

In addition, the presence of the layer of silicon carbide 340 in integrated circuit 300 reduces the pre-irradiation elevated temperature stress (PETS) sensitivity of the device active area of integrated circuit 300. The reduction of PETS sensitivity in integrated circuit 300 increases the radiation hardness of integrated circuit 300. This also increases the reliability of integrated circuit 300 in the presence of the types of radiation listed above.

Figure 4:
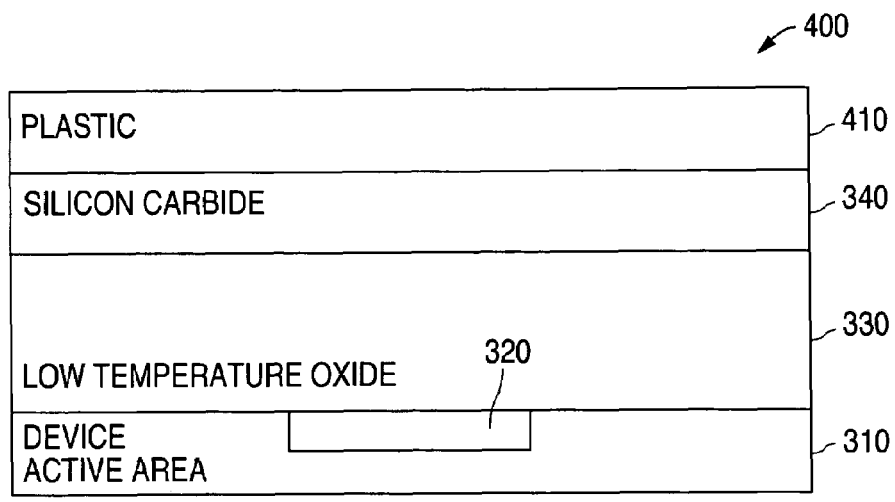
FIG. 4 illustrates a cross sectional schematic view of the integrated circuit shown in FIG. 3 having a plastic encapsulation layer.

The advantageous embodiment of the present invention shown in FIG. 3 may also be encapsulated in a plastic material (e.g., an epoxy material) in order to provide environmental protection to the integrated circuit 300. This embodiment is shown in FIG. 4. FIG. 4 illustrates a cross sectional schematic view 400 of the integrated circuit 300 shown in FIG. 3 together with a plastic encapsulation layer 410. The plastic encapsulation layer 410 is applied directly to the layer of silicon carbide 340.

Figure 5:
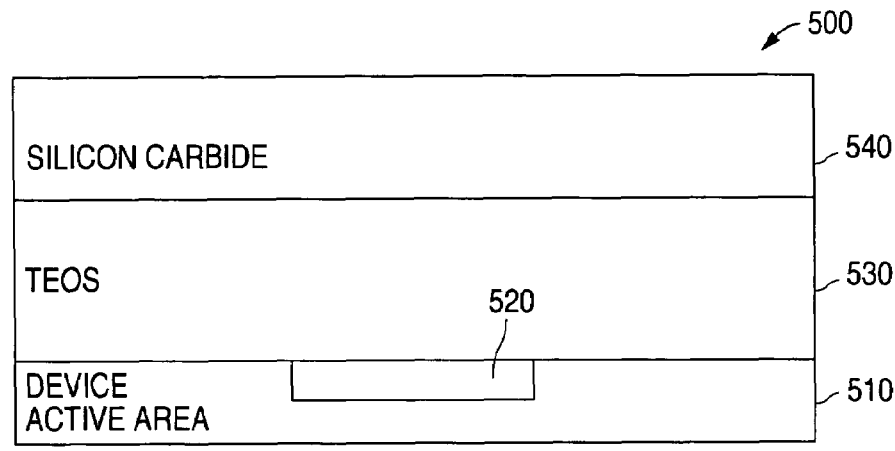
FIG. 5 illustrates a cross sectional schematic view of an advantageous embodiment of an integrated circuit of the present invention having a layer of silicon carbide deposited on a layer of tetraethyl ortho silicate (TEOS) that is deposited over a device active area of the integrated circuit.

FIG. 5 illustrates a cross sectional schematic view of an alternate advantageous embodiment of an integrated circuit of the present invention having a layer of silicon carbide deposited on a layer of tetraethyl ortho silicate (TEOS) that is deposited over a device active area of the integrated circuit. The integrated circuit 500 shown in FIG. 5 comprises a silicon substrate 510. Silicon substrate 510 may be located on a conventional underlying oxide layer (not shown) that is located on an underlying handle wafer (not shown). An exemplary first metal layer 520 is embedded within silicon substrate 510. Silicon substrate 510 and first metal layer 520 comprise the device active area of integrated circuit 500.

A layer of tetraethyl ortho silicate (TEOS) 530 is deposited directly on the device active area of silicon substrate 510 and first metal layer 520. The layer of TEOS 530 may be deposited on the device active areas by using standard spin-on dielectric equipment. The layer of TEOS 530 is a passivation layer that prevents the scratching of the surfaces of the device active layer. The layer of TEOS 530 also prevents contaminants from reaching the surfaces of the device active layer.

A layer of silicon carbide 540 is deposited directly on the layer of TEOS 530. The layer of silicon carbide 540 may be deposited on the layer of TEOS 530 by using standard spin-on dielectric equipment.

The presence of the layer of silicon carbide 540 in integrated circuit 500 reduces the enhanced low dose rate sensitivity (ELDRS) of the device active area of integrated circuit 500. The reduction of ELDRS in integrated circuit 500 increases the radiation hardness of integrated circuit 500. This increases the reliability of integrated circuit 500 in the presence of radiation. In particular, integrated circuit 500 exhibits resistance to the effects of radiation due to electrons, gamma rays, heavy ions, protons, neutrons, alpha particles, and other types of ionizing radiation.

In addition, the presence of the layer of silicon carbide 540 in integrated circuit 500 reduces the pre-irradiation elevated temperature stress (PETS) sensitivity of the device active area of integrated circuit 500. The reduction of PETS sensitivity in integrated circuit 500 increases the radiation hardness of integrated circuit 500. This also increases the reliability of integrated circuit 500 in the presence of the types of radiation listed above.

Figure 6:
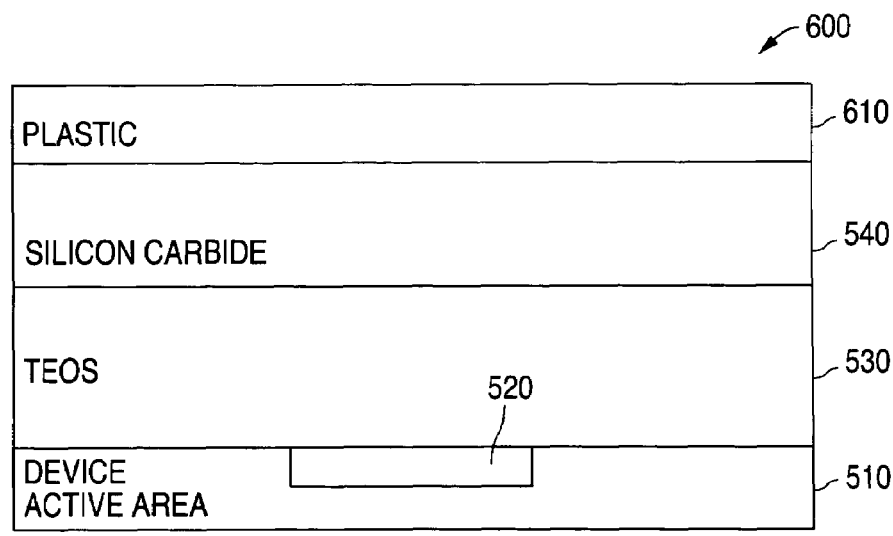
FIG. 6 illustrates a cross sectional schematic view of the integrated circuit shown in FIG. 5 having a plastic encapsulation layer.

The advantageous embodiment of the present invention shown in FIG. 5 may also be encapsulated in a plastic material (e.g., an epoxy material) in order to provide environmental protection to the integrated circuit 500. This embodiment is shown in FIG. 6. FIG. 6 illustrates a cross sectional schematic view 600 of the integrated circuit 500 shown in FIG. 5 together with a plastic encapsulation layer 610. The plastic encapsulation layer 610 is applied directly to the layer of silicon carbide 540.

Figure 7:
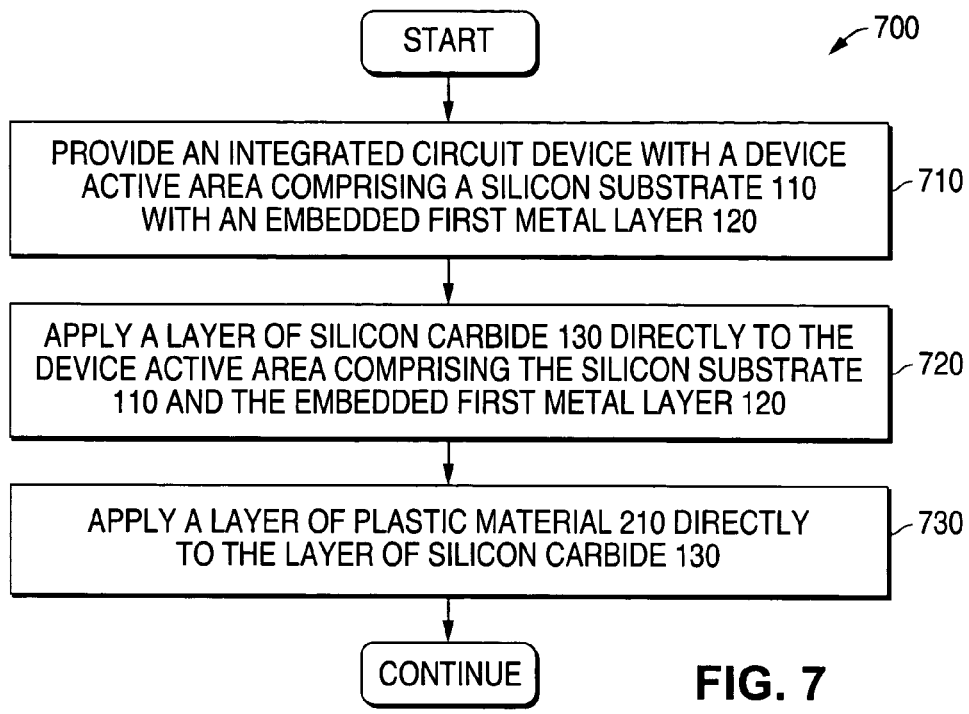
FIG. 7 illustrates a flow chart showing the steps of a first advantageous embodiment of a method of the present invention.

FIG. 7 illustrates a flow chart showing the steps of a first advantageous embodiment of a method of the present invention. In the first step an integrated circuit device is provided that has a device active area comprising a silicon substrate 110 with an embedded first metal layer 120 (step 710). Then a layer of silicon carbide 130 is applied directly to the device active area that comprises the silicon substrate 110 and the embedded first metal layer 120 (step 720). Then a layer of plastic material 210 is applied directly to the layer of silicon carbide 130 (step 730).

Figure 8:
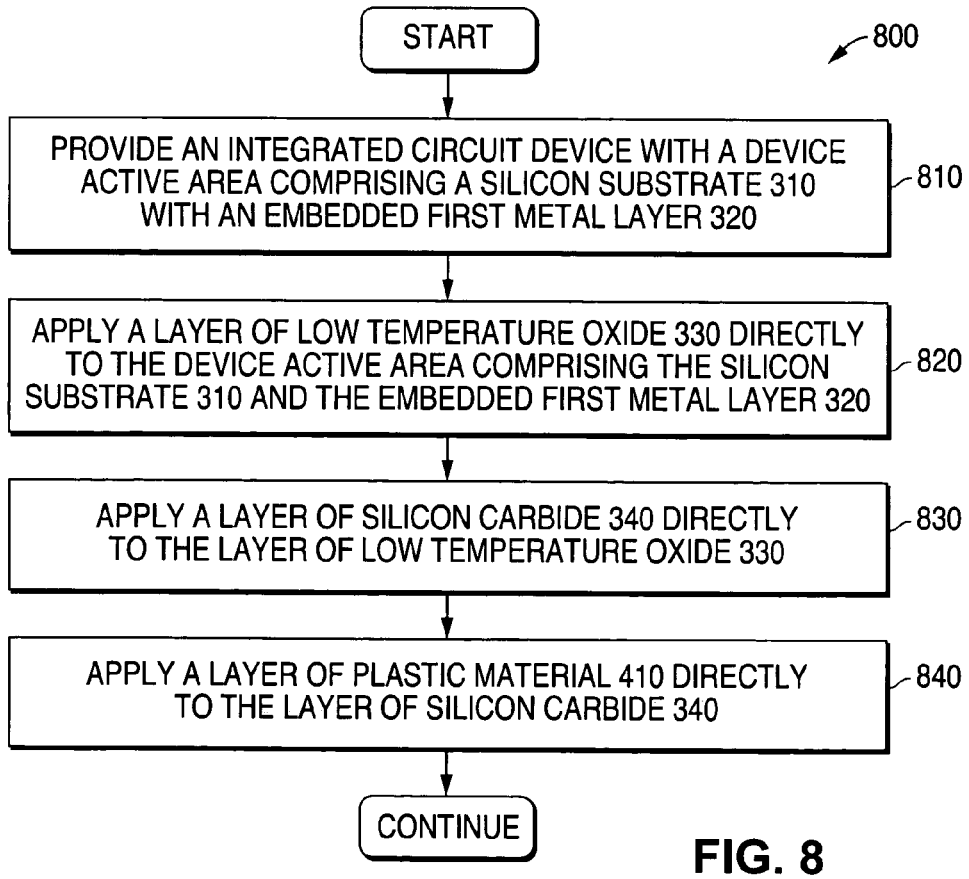
FIG. 8 illustrates a flow chart showing the steps of a second advantageous embodiment of a method of the present invention.

FIG. 8 illustrates a flow chart showing the steps of a second advantageous embodiment of a method of the present invention. In the first step an integrated circuit device is provided that has a device active area comprising a silicon substrate 310 with an embedded first metal layer 320 (step 810). Then a layer of low temperature oxide 330 is applied directly to the device active area that comprises the silicon substrate 310 and the embedded first metal layer 320 (step 820). Then a layer of silicon carbide 340 is applied directly to the layer of low temperature oxide 330 (step 830). Then a layer of plastic material 410 is applied directly to the layer of silicon carbide 340 (step 840).

Figure 9:
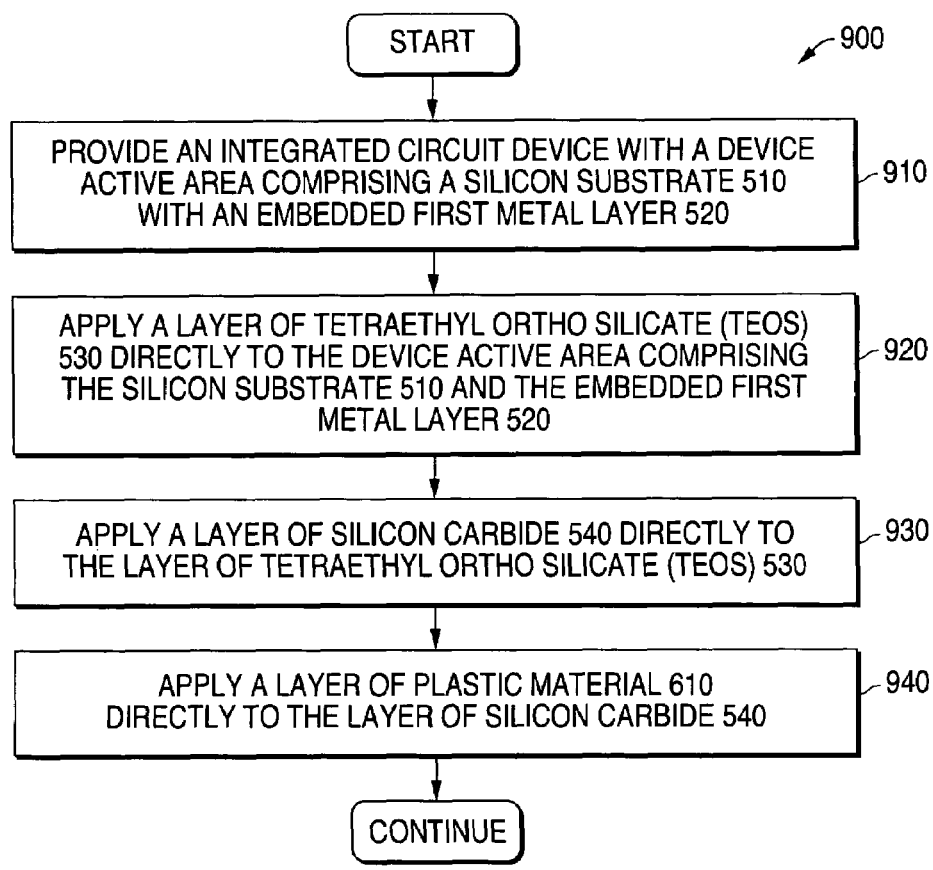
FIG. 9 illustrates a flow chart showing the steps of a third advantageous embodiment of a method of the present invention.

FIG. 9 illustrates a flow chart showing the steps of a third advantageous embodiment of a method of the present invention. In the first step an integrated circuit device is provided that has a device active area comprising a silicon substrate 510 with an embedded first metal layer 520 (step 910). Then a layer of tetraethyl ortho silicate (TEOS) 530 is applied directly to the device active area that comprises the silicon substrate 510 and the embedded first metal layer 520 (step 920). Then a layer of silicon carbide 540 is applied directly to the layer of tetraethyl ortho silicate (TEOS) 530 (step 930). Then a layer of plastic material 610 is applied directly to the layer of silicon carbide 540 (step 940).

An advantageous embodiment of the present invention has been described in which a passivation layer of low temperature oxide has been incorporated into the integrated circuit. Another advantageous embodiment of the present invention has been described in which a passivation layer of tetraethyl ortho silicate (TEOS) has been incorporated into the integrated circuit. The invention is not limited to these examples of passivation layers. It is understood by those skilled in the art that other types of passivation layers may also be utilized in the present invention.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing an integrated circuit, comprising the steps of:
   providing a device active area of an integrated circuit and a first metal layer; and
   applying a layer of radiation resistant material directly on said device active area of said integrated circuit and said first metal layer, the layer of radiation resistant material operable to protect the device active area from radiation in space.

2. The method as set forth in claim 1, further comprising the step of:
   applying a layer of plastic material to said layer of radiation resistant material.

3. The method as set forth in claim 1 wherein said layer of radiation resistant material comprises a layer of silicon carbide.

4. The method as set forth in claim 3 further comprising the step of:
   applying a layer of plastic material to said layer of silicon carbide.

5. The method of claim 1, wherein the device active area comprises a bipolar linear integrated circuit.

6. The method of claim 1, wherein the layer of radiation resistant material is operable to protect the device active area from effects due to electrons, gamma rays, heavy ions, protons, and neutrons.

7. A method for manufacturing an integrated circuit, comprising the steps of:
   providing a device active area of an integrated circuit and a first metal layer; and
   applying directly on said device active area of said integrated circuit and said first metal layer a layer of material operable to reduce sensitivity of said device active area of said integrated circuit to enhanced low dose rate sensitivity (ELDRS) effects of radiation in space.

8. The method as set forth in claim 7 wherein said layer of material that reduces sensitivity of said integrated circuit to enhanced low dose rate sensitivity (ELDRS) effects of radiation comprises a layer of silicon carbide.

9. The method as set forth in claim 8 further comprising the step of:
   applying a layer of plastic material to said layer of material that reduces sensitivity of said integrated circuit to enhanced low dose rate sensitivity (ELDRS) effects of radiation.

10. The method of claim 7, wherein the device active area comprises a bipolar linear integrated circuit.

11. The method of claim 7, wherein the ELDRS effects of radiation comprise effects due to electrons, gamma rays, heavy ions, protons, and neutrons.

12. A method for manufacturing an integrated circuit, comprising the steps of:
   providing a device active area of an integrated circuit and a first metal layer; and
   applying directly on said device active area of said integrated circuit and said first metal layer a layer of material operable to reduce sensitivity of said device active area of said integrated circuit to said pre-irradiation elevated temperature stress (PETS) effects of radiation in space.

13. The method as set forth in claim 12 wherein said layer of material that reduces sensitivity of said integrated circuit to said pre-irradiation elevated temperature stress (PETS) effects of radiation comprises a layer of silicon carbide.

14. The method as set forth in claim 12 further comprising the step of:
   applying a layer of plastic material to said layer of material that reduces sensitivity of said integrated circuit to said pre-irradiation elevated temperature stress (PETS) effects of radiation.

15. The method of claim 12, wherein the device active area comprises a bipolar linear integrated circuit.

16. The method of claim 12, wherein the PETS effects of radiation comprise effects due to electrons, gamma rays, heavy ions, protons, and neutrons.

17. An integrated circuit, comprising:
   a device active area of said integrated circuit;
   a first metal layer; and
   a layer of radiation resistant material applied directly on said device active area of said integrated circuit and said first metal layer, the layer of radiation resistant material operable to protect the device active area from radiation in space.

18. The integrated circuit as set forth in claim 17 wherein said layer of radiation resistant material comprises a layer of silicon carbide.

19. The integrated circuit as set forth in claim 18 further comprising a layer of plastic material applied to said layer of silicon carbide.

20. The integrated circuit of claim 17, wherein the device active area comprises a bipolar linear integrated circuit.

21. The integrated circuit of claim 17, wherein the layer of radiation resistant material is operable to protect the device active area from effects due to electrons, gamma rays, heavy ions, protons, and neutrons.

* * * * *